US010090469B2

(12) United States Patent
Dartnell et al.

(10) Patent No.: US 10,090,469 B2
(45) Date of Patent: Oct. 2, 2018

(54) FABRICATION OF ORGANIC ELECTRONIC DEVICES

(71) Applicants: Cambridge Display Technology Limited, Godmanchester (GB); Sumitomo Chemical Company Limited, Tokyo (JP)

(72) Inventors: Nicholas Dartnell, Cambridgeshire (GB); Nir Yaacobi-Gross, Cambridgeshire (GB)

(73) Assignees: Cambridge Display Technology Limited, Godmanchester (GB); Sumitomo Chemical Company Limited, Tokyo (JP)

( * ) Notice: Subject to any disclaimer, the term of this patent is extended or adjusted under 35 U.S.C. 154(b) by 22 days.

(21) Appl. No.: 15/619,187

(22) Filed: Jun. 9, 2017

(65) Prior Publication Data

US 2017/0365784 A1 Dec. 21, 2017

(30) Foreign Application Priority Data

Jun. 17, 2016 (GB) .................................. 1610556.1

(51) Int. Cl.
*H01L 51/00* (2006.01)
*H01L 27/28* (2006.01)
*H01L 27/32* (2006.01)

(52) U.S. Cl.
CPC ........ *H01L 51/0012* (2013.01); *H01L 27/283* (2013.01); *H01L 27/288* (2013.01); *H01L 27/32* (2013.01)

(58) Field of Classification Search
CPC .................................................. H01L 51/0036
See application file for complete search history.

(56) References Cited

U.S. PATENT DOCUMENTS

2007/0062723 A1* 3/2007 Kim ....................... H05K 3/002
174/255
2012/0280216 A1* 11/2012 Sirringhaus ............... G03F 7/11
257/40
2014/0100313 A1* 4/2014 Schmitt ....................... C08J 3/07
524/173

FOREIGN PATENT DOCUMENTS

JP         2004-006231 A       1/2004
WO    WO 2011/004198 A2       1/2011
WO    WO 2011/139771 A2      11/2011

OTHER PUBLICATIONS

Sakanoue et al., "Fluorosurfactant-assisted photolithography for patterning of perfluoropolymers and solution-processed organic semiconductors for printed displays", Applied Physics Express, vol. 7, No. 10, (2014); http://dx.doi.org/10.7567/APEX.7.101602.*

(Continued)

*Primary Examiner* — Peniel M Gumedzoe
*Assistant Examiner* — Christopher Johnson
(74) *Attorney, Agent, or Firm* — Wolf, Greenfield & Sacks, P.C.

(57) ABSTRACT

A method for the fabrication of organic electronic devices includes forming a fluoropolymer layer over a first area of a substrate and a first set of organic electronic devices. The first set of organic electronic devices are pre-fabricated on a second area of the substrate. The method further includes selectively removing the formed fluoropolymer layer from areas within the first area of the substrate by using a liquid solvent. The method further includes subsequent fabrication of organic electronic devices on the substrate.

10 Claims, 5 Drawing Sheets

(56) References Cited

OTHER PUBLICATIONS

Combined Search and Examination Report dated Dec. 19, 2016 for Application No. GB1610556.1.
GB1610556.1, Dec. 19, 2016, Combined Search and Examination Report.

* cited by examiner

FABRICATION OF ORGANIC ELECTRONIC DEVICES

RELATED APPLICATIONS

This application claims the benefits under 35 U.S.C. § 119(a)-(d) or 35 U.S.C. § 365(b) of British application number GB1610556.1, filed Jun. 17, 2016, the entirety of which is incorporated herein by reference.

The present disclosure relates to the fabrication of organic electronic devices. In particular, the present disclosure relates to a method for selective removal of fluoropolymers during the fabrication of organic electronic devices.

BACKGROUND

Research for developing organic electronic devices is rapidly increasing worldwide as the organic electronic devices have the potential to radically change several aspects of everyday life. Further, the development and encapsulation of the organic electronic devices by low-cost fabrication allows implementation in numerous application areas, such as display screens, lighting, photovoltaics, radio-frequency identification (RFID) and chemical sensors, as well as to new-generation advanced applications.

Typically, such organic electronic devices convert electrical energy into radiation, followed by the detection of signals through various electronic processes. Finally, the radiation is converted back into electrical energy. Some examples of such electronic devices may include, but are not limited to, an organic thin-film transistor (OTFT), organic light-emitting diode (OLED), and organic photodiode (OPD).

Various techniques are utilized for fabrication of the organic electronic devices on substrates to improve their performance parameters, such as efficiency and power gain. A patterning step may be required for the fabrication of such organic electronic devices on the substrates. The process of fabrication and patterning may be carried out by various solution-processing techniques, such as spin-coating and ink-jetting.

Generally, a protective layer may be formed over a single substrate on which multiple organic electronic devices are pre-fabricated. However, in certain scenarios, it may be required to remove the protective layer from a discrete area of the substrate for the fabrication of additional organic electronic devices.

At present, the protective layer may be removed by using dry etching, such as plasma etching or reactive ion etching. However, usage of dry etching may result in the protective layer being either completely or partially removed. In some instances, the technique of dry etching may involve the use of extra mask layers so that active organic layers of the pre-fabricated organic electronic devices may not be attacked. However, such a use of extra-masked layers may lead to an increase in additional lithographic steps and incur additional cost. Further, such techniques for the protective layer removal may have a detrimental knock-on impact on overall device performance.

U.S. Pat. No. 6,274,397B1 discloses the deposition of polymer film (Teflon) on a passivation layer over the circuit elements of a semiconductor package. This is followed by the removal of the said film by use of an organic solvent. The polymer film is removed by dipping the said film in acetone. The drawback of this technique is that it is non-selective, and so all the polymer film must be removed.

U.S. Pat. No. 5,888,309A discloses formation of a microelectronics layer of a material susceptible to sequential etching on a substrate employed within a microelectronics fabrication. The etching is carried out by fluorine containing plasma etch method.

Cho et al, J. Electronic Materials, 1994, 23(8), 827, has disclosed the successful patterning of Teflon by use of $O_2$ or $CF_4/O_2$ plasmas. The article also disclosed that the etching of Teflon was not possible if wet chemicals are used.

Therefore, there is a need for an improved process for selective removal of the protective layer for the fabrication of organic electronic devices that can overcome the aforesaid limitations.

Further limitations and disadvantages of conventional and traditional approaches will become apparent to those skilled in the art, through the comparison of described systems with some aspects of the present disclosure, as set forth in the remainder of the present application and with reference to the drawings.

SUMMARY OF THE INVENTION

A method for selective removal of fluoropolymers for fabrication of organic electronic devices is provided as shown in, and/or described in connection with, at least one of the figures, as set forth more completely in the claims.

In accordance with an embodiment of the present disclosure, a method for selective removal of fluoropolymers as claimed in claim 1 includes forming a fluoropolymer layer. The fluoropolymer layer is fabricated over a first area of a substrate and a first set of organic electronic devices. The first set of organic electronic devices are pre-fabricated on a second area of the substrate. The formed fluoropolymer layer is selectively removed from the said first area of the substrate by using a liquid solvent.

The fluoropolymer layer is not light sensitive, and cannot be patterned using lithography in the same way as a photoresist.

In accordance with an embodiment, the method further includes a second set of organic electronic devices that are fabricated on the first area of the substrate from which the fluoropolymer layer has been removed.

In accordance with an embodiment, the first set of organic electronic devices and the second set of organic electronic devices are selected from the group consisting of organic thin-film transistors (OTFTs), organic light-emitting diodes (OLEDs), and organic photodiodes (OPDs).

In accordance with an embodiment, the fluoropolymer layer may act as a sacrificial layer or a protection layer of the substrate on which the first set of organic electronic devices are fabricated on the second area of the substrate.

In accordance with an embodiment, the formation of the fluoropolymer layer on the substrate is performed by a spin-coating technique or a thermal evaporation technique.

In accordance with an embodiment, the fluoropolymer is selected from the group comprising polytetrafluoroethylene (PTFE or Teflon), Dyneon fluoropolymers, and, poly(vinylidene fluoride-hexafluoropropylene) (p(VDF-HFP)).

In accordance with an embodiment, the liquid solvent is a ketone-based solvent. In accordance with an embodiment, the ketone-based solvent is acetone.

In accordance with an embodiment, the ketone-based solvent is applied in a portion of the first area of the substrate by use of inkjet or dispense printing.

In accordance with an embodiment, the removal of the fluoropolymer layer is performed when the liquid solvent applied on the top surface of the fluoropolymer layer reaches an interface between the bottom surface of the fluoropolymer layer and the first area of the substrate.

In accordance with an embodiment, a pressure is applied for the removal of the fluoropolymer layer from the first area of the substrate when the liquid solvent is applied on the top surface of the fluoropolymer layer.

In accordance with another embodiment, a hole through the fluoropolymer layer is formed that allows the liquid solvent to reach the interface between the bottom surface of the fluoropolymer layer and the first area of the substrate.

In accordance with another aspect of the disclosure, a method of fabrication of electronic devices on a substrate as claimed in claim 13. The method includes forming a fluoropolymer layer over a first area of a substrate and a first set of electronic devices that are pre-fabricated on a second area of the substrate. Further, the method includes the removal of the fluoropolymer layer from the first area of the substrate using a liquid solvent and fabrication of a second set of electronic devices on the first area of the substrate from which the fluoropolymer layer is removed.

In accordance with an embodiment, the first set of electronic devices and the second set of electronic devices are fabricated using solution processing techniques. In accordance with an embodiment, the first set of electronic devices and the second set of electronic devices are organic electronic devices.

In accordance with an embodiment, the first set of electronic devices may include OLEDs and/or OPDs and the second set of electronic devices may include OTFTs.

In accordance with an embodiment, OTFTs are fabricated in one of configurations such as top-contact bottom-gate configuration, bottom-contact bottom-gate configuration, bottom-contact top-gate configuration, and top-contact top-gate configuration.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

References will now be made in detail to embodiments, examples of which are illustrated in the accompanying drawings.

Figure 1A:
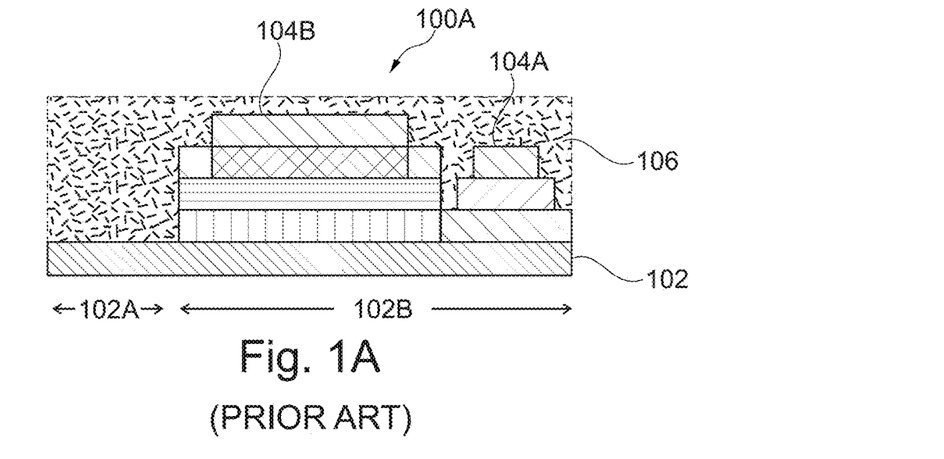
FIG. 1A is a schematic cross-sectional view of a protective layer formed over a first area of a substrate and a first set of organic electronic devices pre-fabricated on a second area of the substrate, in accordance with standard prior art.

FIG. 1A is a schematic cross-sectional view of a protective layer formed over a first area of a substrate and a first set of organic electronic devices pre-fabricated on a second area of the substrate, in accordance with standard prior art. With reference to FIG. 1A, there is shown an integrated organic device structure 100A. The integrated organic device structure 100A may include a substrate 102, a first set of organic electronic devices 104A and 104B, and a protective layer 106. The protective layer 106 may be coated to cover the first area 102A of the substrate 102 and the first set of organic electronic devices 104A and 104B that are pre-fabricated on the second area 102B of the substrate 102. The first set of organic electronic devices 104A and 104B may correspond to OTFTs, OLEDs, and OPDs.

Figure 1B:
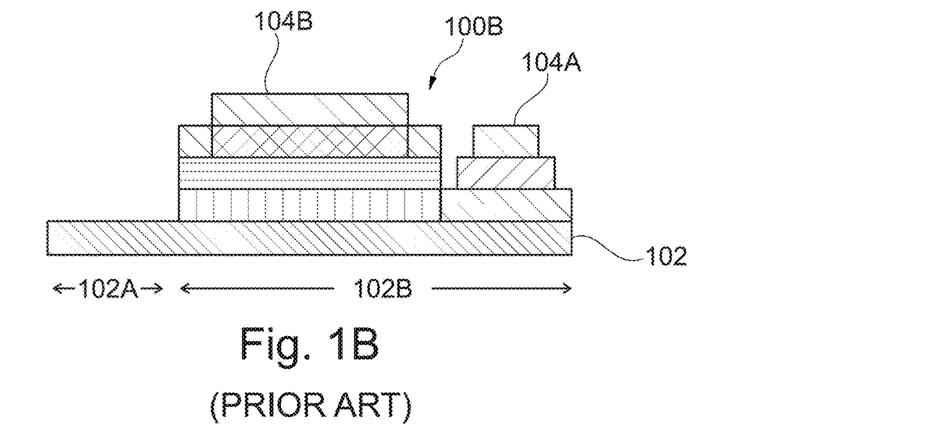
FIG. 1B shows complete removal of the protective layer by dry etching, in accordance with standard prior art.
Figure 1C:
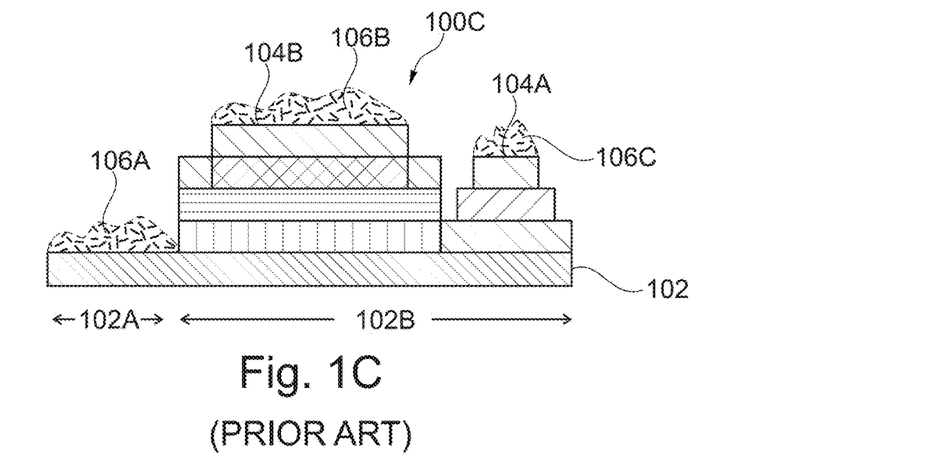
FIG. 1C shows partial removal of the protective layer by use of dry etching, in accordance with standard prior art.

In the prior art, the protective layer 106 may be required to be removed from a discrete area, such as the first area 102A, of the substrate 102 for fabrication of an additional second set of organic electronic devices on the substrate 102. In an instance, dry etching may be used for the removal of the protective layer 106. However, usage of dry etching may result in formation of undesired device structures, as illustrated in exemplary figures FIGS. 1B and 1C. Specifically, FIG. 1B illustrates complete removal of the protective layer 106 from the integrated organic device structure 100A. FIG. 1C illustrates residual portions 106A to 106C of the partially removed protective layer 106 from the integrated organic device structure 100A.

Also, dry etching may involve the use of extra mask layers so that active organic layers of the pre-fabricated organic electronic devices may not be attacked. However, such use of extra masked layers may lead to an increase in additional lithographic steps and incur additional cost. Further, such techniques for the protective layer removal may result in a detrimental knock-on impact on overall device performance.

Once the dry etching is performed on the first area 102A, the second set of additional organic electronic devices, that includes one or more OTFTs, may be fabricated on the first area 102A of the substrate 102.

FIGS. 2A to 2E correspond to a method of fabrication of organic electronic devices, in accordance with an embodiment of the present disclosure.

Figure 2A:
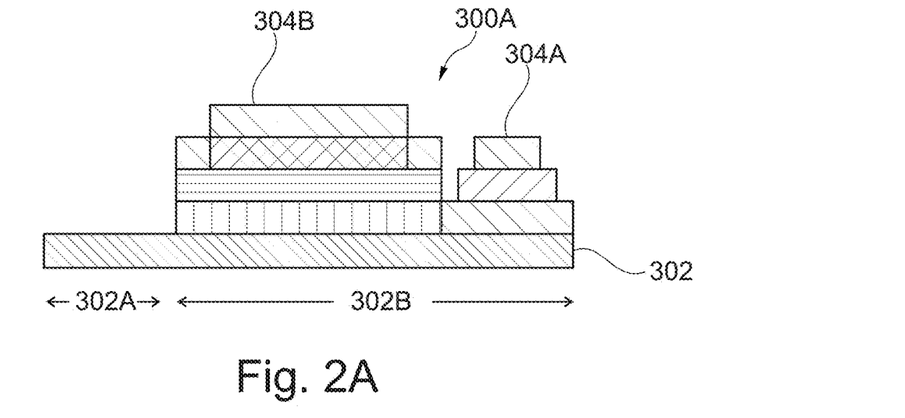
FIG. 2A to 2E corresponds to a method of fabrication of organic electronic devices, in accordance with an embodiment of the present disclosure.

With reference to FIG. 2A, there is shown an integrated organic device structure 300A. The integrated organic device structure 300A includes a substrate 302 that comprises a first area 302A and a second area 302B. There is further shown a first set of organic electronic devices 304A and 304B that are pre-fabricated on the second area 302B of the substrate 302. Examples of the first set of organic electronic devices 304A and 304B may include OLEDs, OTFTs, and/or OPDs. In an instance, a protective layer (not shown) may be present on the first area 302A of the substrate 302. The protective layer may be a fluoropolymer that is present for protection of the first area 302A of the substrate 302.

Figure 2B:
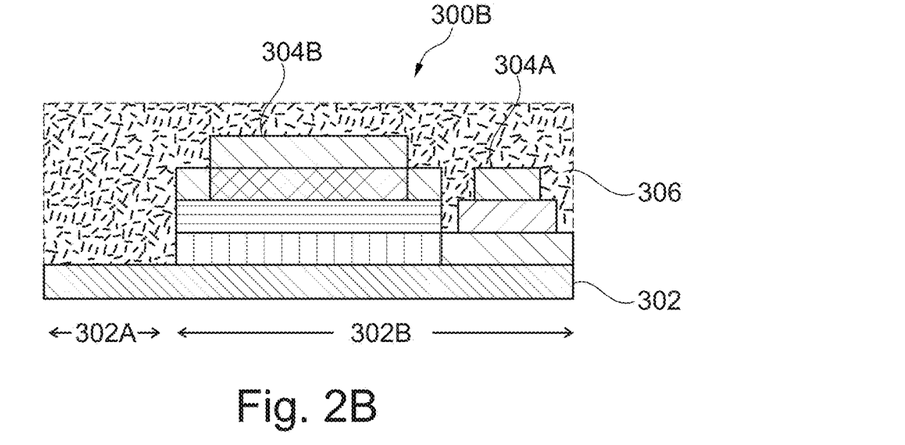

With reference to FIG. 2B, there is shown an integrated organic device structure 300B. The integrated organic device structure 300B includes a substrate 302 that comprises a first area 302A and a second area 302B. There is further shown a fluoropolymer layer 306 formed over the first area 302A of the substrate 302 and the first set of organic electronic devices 304A and 304B for protection from environmental effects. The first set of organic electronic devices 304A and 304B are pre-fabricated on the second area 302B of the substrate 302. The fluoropolymer layer 306 may be formed by one of the spin coating or thermal evaporation technique, known in the art.

In accordance with an embodiment, the fluoropolymer layer 306 may act as a sacrificial layer or a protection layer for the first set of organic electronic devices 304A and 304B pre-fabricated on the second area 302B of the substrate 302. The fluoropolymer layer 306 may comprise a polytetrafluoroethylene (PTFE or Teflon), dyneon fluoropolymer, and poly(vinylidene fluoride-hexafluoropropylene) (p(VDF-HFP)).

Figure 2C:
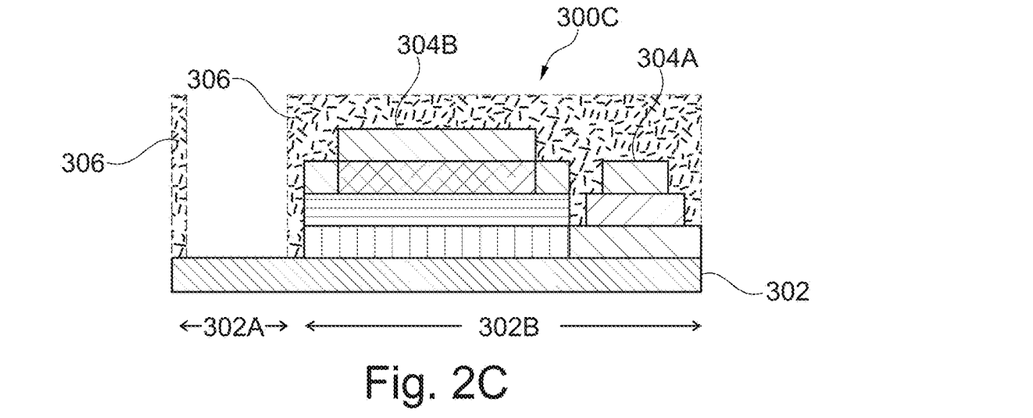

With reference to FIG. 2C, there is shown an integrated organic device structure 300C. The integrated organic device structure 300C illustrates removal of the fluoropolymer layer 306 from the first area 302A of the substrate 302 by use of a liquid solvent. The liquid solvent may be a ketone-based solvent, such as acetone and/or the like.

In accordance with an embodiment, the liquid solvent, such as the ketone-based solvent, is applied on the first area 302A of the substrate 302 by use of an inkjet or dispense printing technique, known in the art. The removal of the fluoropolymer layer 306 is performed when the liquid solvent applied on the top surface of the fluoropolymer layer 306 reaches an interface between bottom surface of the fluoropolymer layer 306 and the first area 302A of the substrate 302.

In an instance, a pressure of a predetermined value may be applied at the top surface of the fluoropolymer layer 306 such that the liquid solvent reaches the interface between bottom surface of the fluoropolymer layer 306 and the first area 302A. In another instance, a hole may be created through the fluoropolymer layer 306 such that the liquid solvent reaches the interface between bottom surface of the fluoropolymer layer 306 and the first area 302A. The liquid solvent when reaches the interface, reduces adhesiveness of the fluoropolymer layer 306 with the first area 302A of the substrate 302. The reduced adhesion facilitates removal of the fluoropolymer layer 306 from the first area 302A.

Figure 2D:
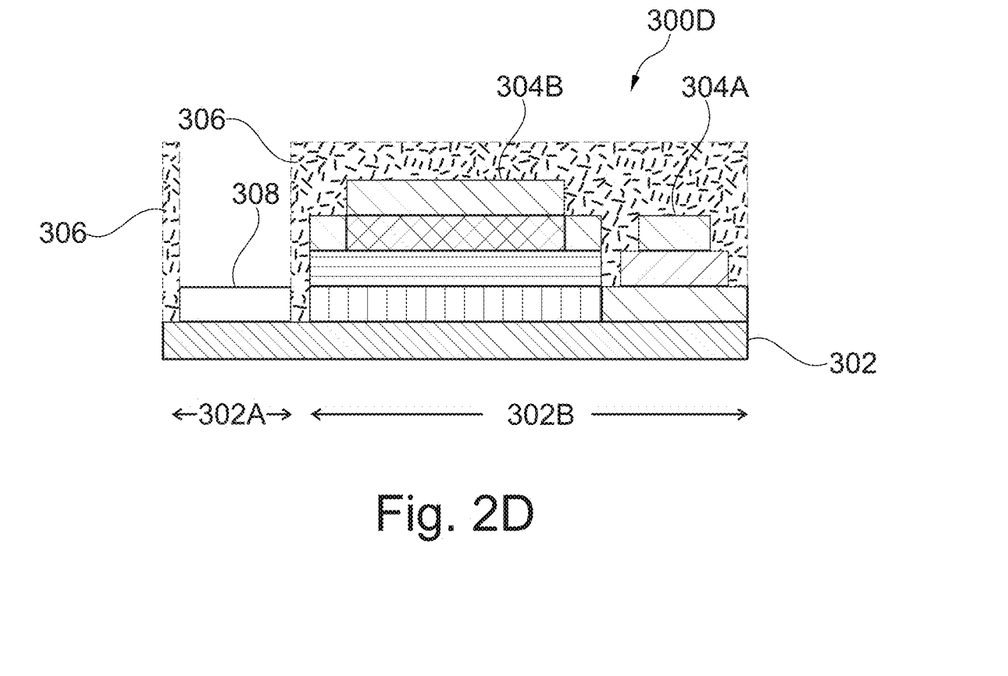
Figure 2E:
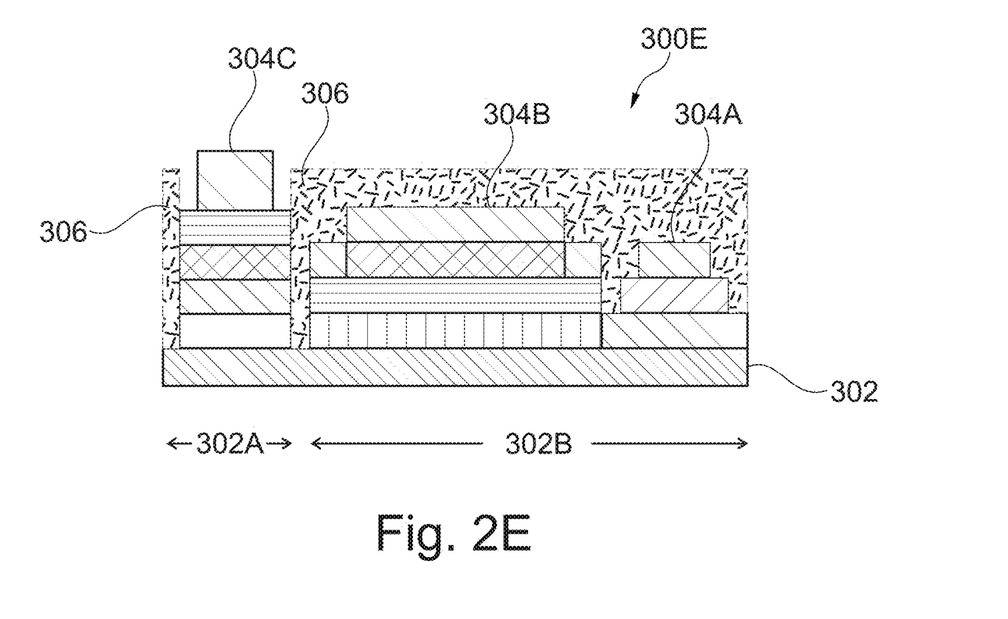

With reference to FIG. 2D, there is shown an integrated organic device structure 300D in which the fluoropolymer layer 306 is removed from the first area 302A of the substrate 302. The integrated organic device structure 300D includes fabrication of an organic semiconductor 308 on the first area 302A. The organic semiconductor 308 fabricated on the first area 302A of the substrate 302 may act as a first layer of the second set of organic electronic devices (such as a second organic electronic device 304C, as illustrated in FIG. 3E). A stack of subsequent layers (with a high dielectric constant) of the second set of organic electronic devices is further illustrated in FIG. 3E. In accordance with an embodiment, the organic semiconductor 308 is fabricated on the first area 302A by use of a spin coating technique, known in the art. Examples of the second set of organic electronic devices such as 304C may include OLEDs, OTFTs, and/or OPDs.

With reference to FIG. 2E, there is shown a complete integrated organic device structure 300E. The complete integrated organic device structure 300E includes the first set of organic electronic devices 304A and 304B. The first set of organic electronic devices 304A and 304B are pre-fabricated on the second area 302B of the substrate 302 covered with the fluoropolymer layer 306. The organic semiconductor 308, as the first layer of the second set of organic electronic devices (such as the second organic electronic device 304C), is also fabricated on the first area 302A of the substrate 302, as described in FIG. 3D.

With reference to FIG. 2E, the stack of subsequent layers of the second set of organic electronic devices (such as the second organic electronic device 304C) is fabricated on top of the organic semiconductor 308. The stack of subsequent layers may be fabricated by use of the spin coating technique, known in the art. The second organic electronic device 304C in this example is an OTFT. For brevity, FIG. 2E illustrates only one second organic electronic device 304C. However it may be understood that more than one second organic electronic devices may be fabricated on the first area 302A, without deviation from the scope of the disclosure. The configuration of the second organic electronic device 304C may be one of: top-contact bottom-gate configuration, bottom-contact bottom-gate configuration, bottom-contact top-gate configuration, and top-contact top-gate configuration, as known in the art.

Figure 3:
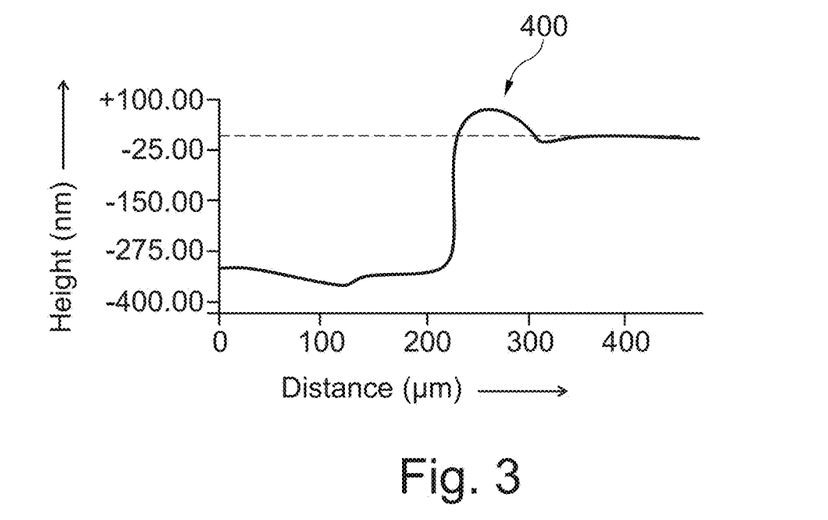
FIG. 3 shows a plot of height of the fluoropolymer layer formed on the substrate versus the distance, in accordance with an embodiment of the present disclosure.

FIG. 3 shows a plot of height of the fluoropolymer layer formed on the substrate versus the distance, in accordance with the present disclosure—"Height (nm)", on y-axis, "Distance (µm)", on x-axis.

From the computer modelled graphical plot 400, it is observed that wherever liquid solvent is applied on the surface of an exemplary fluoropolymer layer formed on an exemplary substrate, there is a significant decrease in the height of the exemplary fluoropolymer layer. The remaining surface of the exemplary fluoropolymer layer which is not in contact with the liquid solvent, shows no variation in the height of the fluoropolymer layer.

Figure 4:
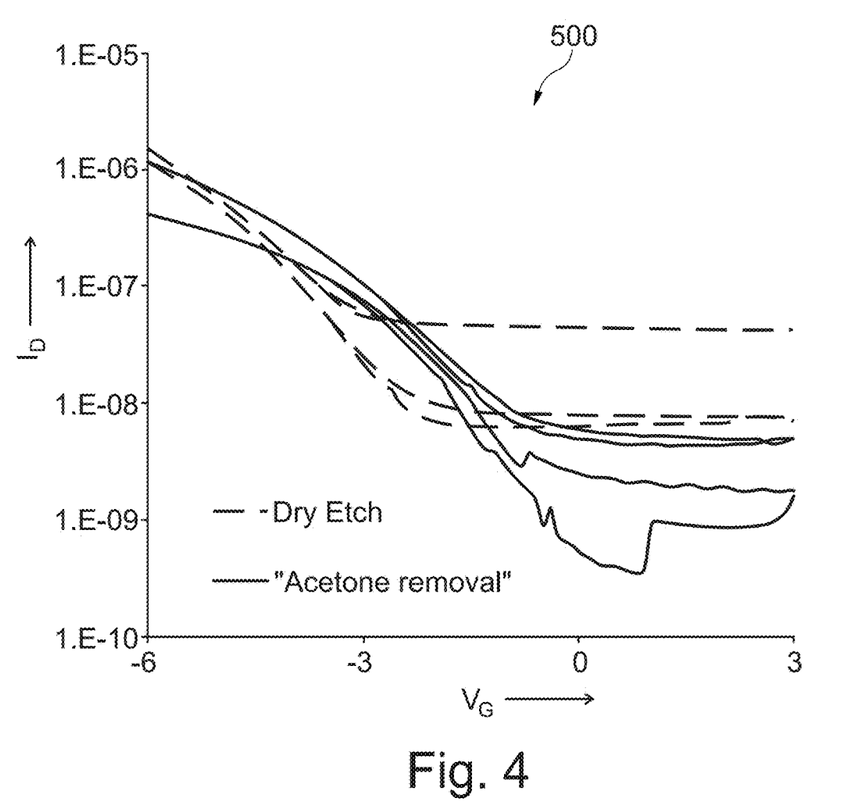
FIG. 4 shows an experimental plot of drain current versus gate voltage for a second set of organic electronic devices, that includes one or more OTFTs, fabricated on the first area of the substrate after liquid solvent-based etching for fluoropolymer layer removal, in accordance with an embodiment of the present disclosure, compared with dry etching as described in the prior art.

FIG. 4 shows an experimental plot of drain current versus gate voltage for a second set of organic electronic devices that includes one or more OTFTs, fabricated on the first area of the substrate after liquid solvent-based etching for fluoropolymer layer removal, in accordance with an embodiment of the present disclosure. With reference to FIG. 4, there is shown a computer modelled graphical plot 500 depicting the values of the drain current, $|I_D|$, of the one or more OTFTs on y-axis and the gate voltage, $V_G$, of the one or more OTFTs on x-axis.

With reference to FIG. 4, the data can be compared with the dry etched prior art data shown on the same graph. The one or more OTFTs, fabricated on the first area 302A of the substrate 302 after liquid solvent-based etching for fluoropolymer layer removal, has higher on/off current ratio in comparison to the one or more OTFTs fabricated on the first area 102A of the substrate 102 after use of dry etching for protective layer removal. There may also be observed a reduction in the threshold voltage and off currents. The increase in the on/off current ratio of the one or more OTFTs and the reduction in the threshold voltage and off currents may enhance the device performance of the complete integrated organic device structure 300E (as described in FIG. 2E) as compared to the ones based on the integrated organic device structures 100B and 100C (as described in FIGS. 1B and 1C, respectively).

Figure 5:
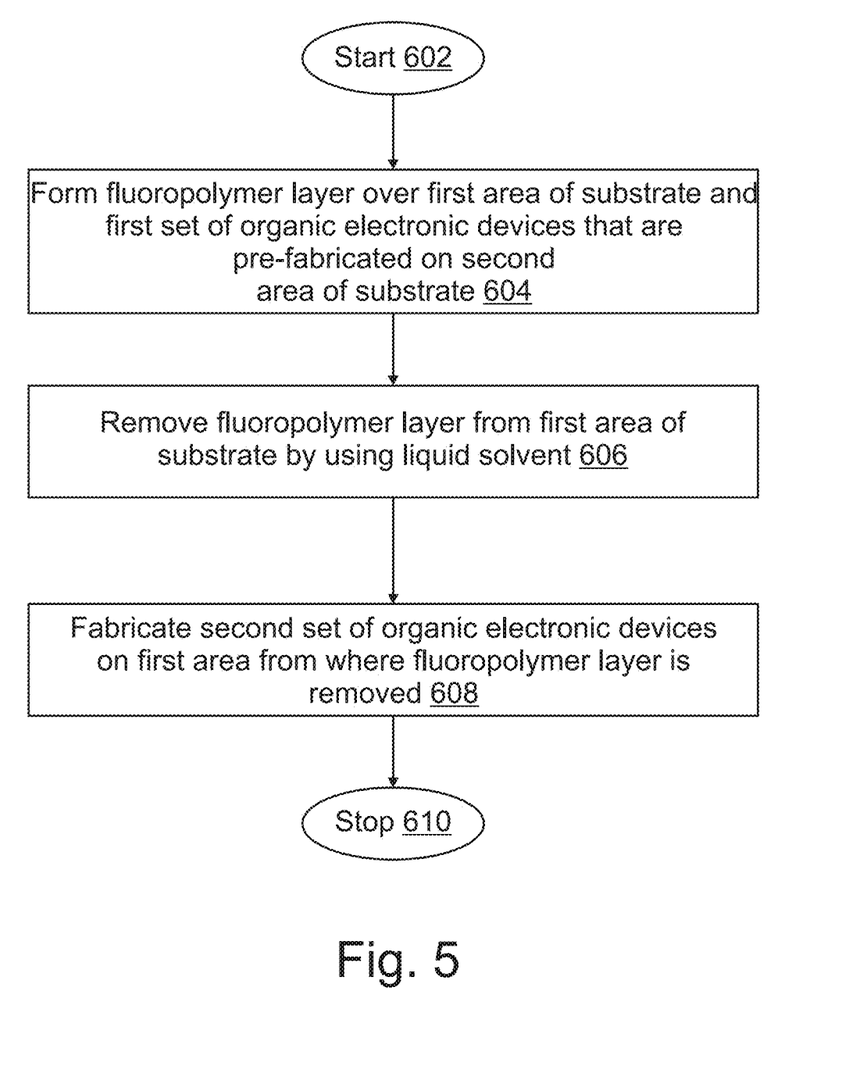
FIG. 5 shows a flow chart for a method of fabrication of organic electronic devices, in accordance with an embodiment of the present disclosure.

FIG. 5 shows a flow chart for a method of fabrication of organic electronic devices, in accordance with an embodiment of the present disclosure. FIG. 6 has been described in conjunction with FIGS. 2A to 2E. The method starts at step 602 and proceeds to step 604.

At step 604, the fluoropolymer layer 306 is formed over the first area 302A of the substrate 302 and the first set of organic electronic devices 304A and 304B that are pre-fabricated on the second area 302B of the substrate 302. The fluoropolymer layer 306 may be formed by one of the spin coating or thermal evaporation technique, known in the art. The first set of organic electronic devices 304A and 304B may correspond to OTFTs, OLEDs, and OPDs. The fluoropolymer layer 306 may act as a sacrificial layer or a protection layer for the first set of organic electronic devices 304A and 304B pre-fabricated on the second area 302B of the substrate 302. The fluoropolymer layer 306 may comprise a polytetrafluoroethylene (PTFE or Teflon), dyneon fluoropolymer, and poly(vinylidene fluoride-hexafluoropropylene) (p(VDF-HFP)).

At step 606, the fluoropolymer layer 306 is removed from the first area 302A of the substrate 302 by using a liquid solvent, such as a ketone-based solvent. An example of such ketone-based solvent is acetone. The ketone-based solvent is applied in a portion of the first area 302A of the substrate 302 by use of inkjet or dispense printing. The removal of the fluoropolymer layer 306 is performed when the liquid solvent applied on top surface of the fluoropolymer layer 306 reaches an interface between bottom surface of the fluoropolymer layer 306 and the first area 302A of the substrate 302. Further, a pressure may be applied for the removal of the fluoropolymer layer 306 from the first area 302A of the substrate 302 when the liquid solvent is applied on the top surface of the fluoropolymer layer 306. Alternatively, a hole may be formed through the fluoropolymer layer 306 for allowing the liquid solvent to reach the interface between the bottom surface of the fluoropolymer layer 306 and the first area 302A of the substrate 302.

At step 608, the second set of electronic devices, such as the second organic electronic device 304C, is fabricated on the first area 302A of the substrate 302 from which the fluoropolymer layer 306 is removed. In an instance, the second organic electronic device 304C corresponds to an OTFT. In another instance, the second organic electronic device 304C corresponds to an OLED or an OPD. In accordance with an embodiment, the second organic electronic device 304C may be fabricated by use of various solution-processing techniques, such as spin-coating and ink-jetting. Control proceeds to end step 610.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A method for selective removal of fluoropolymers which are not sensitive to light, the method comprising:
    forming a fluoropolymer layer over a first area of a substrate and a first set of organic electronic devices that are pre-fabricated on a second area of the substrate; and subsequently
    selectively removing the formed fluoropolymer layer from said first area of the substrate by using a liquid solvent without removing the formed fluoropolymer layer from the second area, wherein the removal of the fluoropolymer layer is performed when the liquid solvent applied on top surface of the fluoropolymer layer reaches an interface between bottom surface of the fluoropolymer layer and the first area of the substrate; and
    applying a pressure for the removal of the fluoropolymer layer from the first area of the substrate when the liquid solvent is applied on the top surface of the fluoropolymer layer.

2. The method as claimed in claim 1, further comprising fabricating a second set of organic electronic devices on the first area of the substrate from which the fluoropolymer layer is removed.

3. The method as claimed in claim 1, wherein the first set of organic electronic devices and the second set of organic electronic devices are selected from the group consisting of: organic thin-film transistors (OTFTs), organic light-emitting diodes (OLEDs), and organic photodiodes (OPDs).

4. The method as claimed in claim 1, wherein the fluoropolymer layer acts as a sacrificial layer or a protection layer of the substrate on which the first set of organic electronic devices are fabricated on the second area of the substrate.

5. The method as claimed in claim 1, wherein the formation of the fluoropolymer layer on the substrate is performed by one of: a spin coating technique or a thermal evaporation technique.

6. The method as claimed in claim 1, wherein the fluoropolymer is selected from a group consisting of: polytetrafluoroethylene (PTFE), and poly(vinylidene fluoride-hexafluoropropylene) (p(VDFHFP)).

7. The method as claimed in claim 1, wherein the liquid solvent is a ketone-based solvent.

8. The method as claimed in claim 7, wherein the ketone-based solvent is acetone.

9. The method as claimed in claim 7, wherein the ketone-based solvent is applied in a portion of the first area of the substrate by using inkjet or dispense printing.

10. A method for selective removal of fluoropolymers which are not sensitive to light, the method comprising:
    forming a fluoropolymer layer over a first area of a substrate and a first set of organic electronic devices that are pre-fabricated on a second area of the substrate; and subsequently
    selectively removing the formed fluoropolymer layer from said first area of the substrate by using a liquid solvent without removing the formed fluoropolymer layer from the second area, wherein the removal of the fluoropolymer layer is performed when the liquid solvent applied on top surface of the fluoropolymer layer reaches an interface between bottom surface of the fluoropolymer layer and the first area of the substrate; and forming a hole through the fluoropolymer layer for allowing the liquid solvent to reach the interface between the bottom surface of the fluoropolymer layer and the first area of the substrate.

\* \* \* \* \*